(12) United States Patent
Semkow et al.

(10) Patent No.: US 7,425,278 B2
(45) Date of Patent: Sep. 16, 2008

(54) PROCESS OF ETCHING A TITANIUM/TUNGSTEN SURFACE AND ETCHANT USED THEREIN

(75) Inventors: Krystyna Waleria Semkow, Poughquag, NY (US); Anurag Jain, Poughkeepsie, NY (US); Kamalesh K. Srivastava, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/563,858

(22) Filed: Nov. 28, 2006

(65) Prior Publication Data

US 2008/0124939 A1    May 29, 2008

(51) Int. Cl.
*C23C 1/00* (2006.01)

(52) U.S. Cl. .................. 216/90; 216/100; 216/108; 438/754

(58) Field of Classification Search .............. 216/90, 216/100, 108; 438/754
See application file for complete search history.

(56) References Cited

U.S. PATENT DOCUMENTS

| 4,554,050 A |  | 11/1985 | Minford et al. |  |
|---|---|---|---|---|
| 4,671,852 A |  | 6/1987 | Pyke |  |
| 4,814,293 A |  | 3/1989 | Van Oekel |  |
| 5,211,807 A | * | 5/1993 | Yee | 216/100 |
| 5,462,638 A |  | 10/1995 | Datta et al. |  |
| 5,517,080 A | * | 5/1996 | Budzilek et al. | 313/509 |
| 6,365,482 B1 | * | 4/2002 | Maghsoudnia | 438/384 |
| 6,379,577 B2 |  | 4/2002 | Akatsu et al. |  |

FOREIGN PATENT DOCUMENTS

| JP | 5136119 A | 6/1993 |
|---|---|---|
| JP | 11054474 A | 2/1999 |

* cited by examiner

*Primary Examiner*—Binh X Tran
(74) *Attorney, Agent, or Firm*—Scully, Scott, Murphy & Presser, P.C.; Kerry B. Goodwin, Esq.

(57) ABSTRACT

An etchant which includes an aqueous solution of between about 30% and about 38% concentrated hydrogen peroxide, said percentages being by volume, based on the total volume of the solution; between about 3.5 ml and about 20 ml per liter of phosphoric acid; and an amount of potassium hydroxide to adjust the pH of the solution to between about 7.8 and about 9.1. The etchant is useful in removing a layer of an alloy of titanium and tungsten or a layer of tungsten from a precision surface.

6 Claims, No Drawings

PROCESS OF ETCHING A TITANIUM/TUNGSTEN SURFACE AND ETCHANT USED THEREIN

BACKGROUND OF THE DISCLOSURE

1. Field of the Invention

The present invention is directed to a process of etching a titanium-tungsten alloy surface and the etchant used therein. More specifically, the present invention relates to a process of etching a titanium-tungsten alloy surface used in C4 fabrication and the etchant used therein.

2. Background of the Prior Art

C4 is an advanced microelectronic chip packaging and connection technology. "C4" stands for Controlled Collapse Chip Connection. C4 is also known as "solder bump".

The basic idea of C4 is to connect chips to substrates by means of solder balls between two surfaces of the units. These tiny balls of electrically conductive solder bridge the gaps between respective pairs of metal pads on the units being connected. Each pad has a corresponding pad on the other unit's surface; the pad arrangements are mirror images. As the units are reflowed together the solder balls on the pads of the first unit are pressed against corresponding conductive pads (having no balls) on the second unit, the solder balls melt, wet pads on the second unit, making connections between respective pads.

In C4 technology the solder balls are formed directly on the metal pads of the one unit. The pads are electrically isolated from other components by the insulating material that surrounds each pad. The material might be un-doped silicon (Si) or some other material. The bottom of the pad is electrically connected into the chip circuit.

A major application of C4 is in joining semiconductor microchips (integrated circuits) to chip packages. Chips usually are made in rectangular arrays on a mono-crystalline slab of silicon, called a "wafer," which is a thin disc at least several inches across. Many chips are formed on each wafer, and then the wafer is diced into individual chips. The C4 balls are placed on the chips while they are still joined in a wafer.

The wafers are made as large as possible so as to reduce the number wafers that must be processed to make a certain number of chips. For the same reason (among others) the chips are made as small as possible. Thus, the best C4 fabrication system is one that can make highest density of very small, closely-spaced solder balls each precisely placed over a large area.

Electrical engineers are constantly placing more and more circuits onto each chip, to improve performance and reduce cost. As the number of circuits on a chip grows, so does the number of connections needed. C4, which allows more connections in a small space than any other technique, is commercially important.

One method of forming solder bumps uses sputtering or vacuum deposition. Solder metal is evaporated in a vacuum chamber. The metal vapor coats everything in the chamber with a thin film of the evaporated metal. To form solder bumps on the wafer, the vapor is allowed pass through holes in a metal mask held over the wafer. The solder vapor passing through the holes deposits onto pads on wafer surface. Vacuum deposition step is followed by solder reflow to form rounded solder balls.

An alternative technique for making solder bumps is electrodeposition, also called electrochemical plating or electroplating. This method also uses a mask and forms solder bumps only at the selected sites, but the technique is very different from the evaporation method.

Solder bump electrodeposition requires a first preliminary step, the creation of a continuous "seed layer" of conductive metal such as copper. The seed layer is needed to conduct the electricity which deposits solder. The seed layer is deposited onto a "barrier metal" or alloy layer deposited on wafer.

The second preliminary step, after the seed layer is laid down, is to form a mask by photolithography. A layer of photoresist is laid onto the seed layer and exposed to light. Un-exposed photoresist can then be washed away to leave the cured photoresist behind as a mask.

When the exposed photoresist has been cured and the uncured photoresist has been removed, the mask is complete. The mask has rows of holes where the solder bumps are to be deposited.

The third step is electrodeposition (electroplating) of solder into the mask holes. An electrodeposited solder bump B is shown in FIG. 1A. The resultant solder bump B might be 60-80 micrometer thick.

After the solder bumps are formed, the mask of cured photoresist is removed. The substrate now is covered with the continuous seed layer and numerous solder bumps.

After the seed layer is deposited over the substrate and the C4 bumps have been formed, the seed layer is desirably removed in between the solder bumps. The removal can be done by chemical etching or by electroetching. Removal of the copper seed layer exposes "barrier" layer of metal alloy between C4 bumps.

Alloys of titanium (Ti) and tungsten (W) primarily, but also pure tungsten, have been used in the prior art as "barrier" layers to protect chip interconnection during certain processes. A thin film of Ti—W can be applied by conventional microelectronic techniques like sputtering.

In the processing of Ti/W alloy and W surfaces, it is desirable to remove the Ti/W alloy surface. This step is usually accomplished by etching. Etching agents utilized in the prior art were usually aqueous solutions of concentrated hydrogen peroxide (30% concentration) and ammonium hydroxide. Typically, an etchant solution may comprise 40% concentrated (30%) hydrogen peroxide, 10% concentrated (30%) ammonium hydroxide and 50% water, where the percentage are by volume, based on the total volume of the etchant solution.

The aforementioned etching solution, denoted in the art as SC-1 type etchant, successfully removes a Ti/W alloy or W surface. However, there are serious shortcomings associated with this etchant. For one thing, this etchant has a short shelf life due to its high self decomposition rate. Therefore, the etchant must be prepared just before it is used. This creates serious production problems.

Another serious problem relates to the overeffectiveness of the SC-1 type etch. At its usual pH of 10, employed under immersion type etching conditions, Ti/W undercutting of an order of several micrometers is common.

It is thus not surprising that the development of effective etch solutions in the etching of Ti/W alloy, W and similar surfaces, especially in C4 fabrication has been the subject of significant activity. A sample of such activity is summarized below.

U.S. Pat. No. 5,462,638 issued to Datta et al. discloses an etchant of 30% by weight aqueous hydrogen peroxide; water in which 15 to 40 grams of a salt of ethylene diamine tetraocetic acid EDTA) is dissolved; and between 100 and 200 grams of the potassium sulfate salt protecting the coating from attack by the etchant. The etchant includes no potassium hydroxide.

U.S. Pat. No. 6,379,577 to Akatsu et al. refers to a process of selectively wet etching a titanium based perovskite material disposed on a silicon oxide or silicon nitride substrate. The etchant is a solution of hydrogen peroxide, an acid and deionized water. The titanium-based perovskite material is barium strontium titanate, barium titanate, strontium titanate or lead titanate.

The surface treated in the Akatsu et al. process is a titanate salt rather than a titanium alloy. Moreover, the etchant solution contains no potassium hydroxide, a compound required in etching of Ti/W alloy surfaces. Finally, the etching process in Akatsu et al. includes no solder bumps.

Japanese Patent Publication No. 11-054474 sets forth both an etchant comprising a mixture of phosphoric acid, hydrogen peroxide and water. Again, this etchant includes no potassium hydroxide, necessary to etch Ti/W alloy surfaces. Moreover, the process of the publication '474 publication is directed to the etching of a titanium compound semiconductor surface rather than a titanium alloy surface.

Japanese Patent Publication No. 5-136119 teaches a solution for etching the surface of a semiconductor wafer which contains phosphoric acid or a phosphate which may be sodium metaphospbate, trisodium phosphate, sodium trimetaphosphate or sodium tripolyphosphate and hydrogen peroxide. Specifically, the etchant is prepared by adding phosphoric acid or the phosphate to ammonia, hydrogen peroxide and water. Again, this etchant includes no potassium hydroxide and includes ammonia.

Other prior art etches include that disclosed in U.S. Pat. No. 4,671,852 to Pyke which includes hydrogen peroxide, EDTA and ammonium hydroxide.

U.S. Pat. No. 4,814,293 to VanOckel provides an etchant which comprises a solution of hydrogen peroxide solution buffered to a pH of 1 to 6 with acetic acid or ammonium acetate as preferred buffering agents.

An acidic etching solution of the type taught by VanOckel cannot be used to etch an alloy of titanium and tungsten.

Finally, U.S. Pat. No. 4,554,050 to Minford et al. employs an etchant composed of hydrogen peroxide, water, ammonium hydroxide and EDTA. However, the Minford et al. etchant is utilized only to etch titanium surfaces.

It is apparent that some of the above activity addresses the problems of Ti/W alloy and W surface etching. However, there is still a pressing need in the art for a new etching agent which can be used in an etch bath of the immersion type for Ti/W alloy and W surfaces on semiconductor wafers which are stable and provide undercut control.

BRIEF SUMMARY OF THE INVENTION

A new etching agent has now been discovered which has reasonably stable shelf life such that the etchant need not be used immediately upon its fabrication. Although this new etchant has been found to effectively etch Ti/W and W surfaces and is thus effective in processes involving C4 fabrication, it has been found not to cause undercutting.

In accordance with the present invention a new etchant is provided which includes an aqueous solution of between about 30% and about 38% concentrated (30%) hydrogen peroxide, said percentages being by volume, based on the total volume of the solution, between about 3.5 ml and 20 ml per liter of phosphoric acid and an amount of potassium hydroxide sufficient to adjust the pH to a range of between about 7.8 and about 9.1.

In further accordance with the present invention a process of etching a Ti/W or W layer from a precision surface is provided. In this process the Ti/W layer on the semiconductor wafer is removed by immersing the semiconductor wafer in a bath of the etchant of the present invention.

DETAILED DESCRIPTION

An etchant employed in the removal on a layer of a titanium/tungsten alloy or tungsten disposed on a precision surface, especially a semiconductor wafer, is prepared by combining concentrated hydrogen peroxide (30%) with water such that the hydrogen peroxide constitutes between about 30% and about 38%, said percentages being by volume, based on the total volume of the aqueous solution. To this solution is added between about 3.5 ml and about 20 ml per liter of phosphoric acid and a sufficient quantity of potassium hydroxide to adjust the pH of the solution to between about 7.8 and about 9.1.

More preferably, the etchant solution comprises an aqueous solution which includes between about 34% and about 36% by volume concentrated (30%) hydrogen peroxide, between about 7.5 ml and about 15 ml per liter of phosphoric acid (85% concentration) and an amount of potassium hydroxide to adjust the pH of the solution to between about 7.9 and about 8.5.

More preferably, the etchant solution comprises about 35% by volume concentrated $H_2O_2$, between about 10 ml and about 13 ml per liter of phosphoric acid (85% concentration) and an amount of potassium hydroxide so that the pH of the solution is between about 8.0 and about 8.4.

The aforementioned etching solution is employed in a process of controlled collapse chip connection wherein the solder bumps are formed by electrochemical plating. In this process the seed layer of conductive copper metal is removed first exposing titanium/tungsten (Ti/W) alloy or tungsten (W) "barrier" layer. That "barrier" layer is removed from a precision surface by immersion of the Ti/W or W layer covered precision surface in a bath, maintained at ambient temperature, of an etchant solution. That etchant solution must remove the "barrier" layer. Importantly, this etchant solution must not remove the solder bumps. The etchant solution of the present invention effectively removes the Ti/W or W layer without removal of the solder bumps. In a particularly preferred embodiment the precision surface is a semiconductor wafer.

What is claimed is:

1. A process of dissolving a layer of an alloy of titanium and tungsten, disposed on a precision surface, comprising immersing a precision surface covered by a layer of an alloy of titanium and tungsten in a bath of an etchant comprising an aqueous solution comprising between about 34% to about 36% hydrogen peroxide, said percentages being by volume, based on the total volume of the solution; between about 7.5 ml and about 15 ml per liter of phosphoric acid; and an amount of potassium hydroxide to adjust the pH of the solution to a range of between about 7.9 and about 8.5.

2. A process in accordance with claim 1 wherein said precision surface is a semiconductor wafer.

3. A process in accordance with claim 2 wherein said etchant bath is maintained at ambient temperature.

4. A process in accordance with claim 1 wherein said hydrogen peroxide is present in a concentration of about 35% by volume; said phosphoric acid is present in a concentration of between about 10 ml and about 13 ml per liter; and said potassium hydroxide is present in a concentration such that the pH of the solution is in the range of between about 8.0 and about 8.4.

5. A process in accordance with claim 4 wherein said precision surface is a semiconductor wafer.

6. A process in accordance with claim 5 wherein said etchant bath is maintained at ambient temperature.

* * * * *